US009685967B1

(12) United States Patent
Motz et al.

(10) Patent No.: US 9,685,967 B1
(45) Date of Patent: Jun. 20, 2017

(54) CHOPPER STABILIZED SIGMA DELTA ADC

(71) Applicant: Infineon Technologies AG, Neubiberg (DE)

(72) Inventors: Mario Motz, Wernberg (AT); Dan Stoica, Bucharest (RO); Andrei Gheorghe, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/259,205

(22) Filed: Sep. 8, 2016

(51) Int. Cl.
*H03M 1/06* (2006.01)
*H03M 3/00* (2006.01)

(52) U.S. Cl.
CPC .............. *H03M 1/06* (2013.01); *H03M 3/458* (2013.01)

(58) Field of Classification Search
CPC ........ H03M 1/06; H03M 3/458; H03M 1/203; H03M 1/207; H03M 1/1023; H03M 3/30; H03M 3/50; H03M 7/3004; H03M 1/12
USPC ................. 341/118, 143, 155, 120, 119, 117
See application file for complete search history.

(56) References Cited

U.S. PATENT DOCUMENTS

| | | | |
|---|---|---|---|
| 6,674,322 B2 | 1/2004 | Motz | |
| 7,098,827 B2 | 8/2006 | Motz | |
| 7,714,757 B2 | 5/2010 | Denison et al. | |
| 7,999,710 B2 * | 8/2011 | Matthews | H03M 3/34 341/143 |
| 8,072,208 B2 | 12/2011 | Motz | |
| 8,203,471 B2 * | 6/2012 | Motz | H03M 1/02 341/110 |
| 8,633,843 B2 * | 1/2014 | Ceballos | H03M 3/344 341/118 |
| 8,665,128 B2 * | 3/2014 | Silva | G01R 19/02 327/179 |
| 8,760,330 B2 * | 6/2014 | Ritter | H03M 3/368 341/143 |
| 8,829,988 B2 * | 9/2014 | Motz | H03F 3/387 330/9 |

(Continued)

OTHER PUBLICATIONS

Motz, M. et al. "A miniature digital current sensor with differential Hall probes using enhanced chopping techniques and mechanical stress compensation." 4 pages.

(Continued)

*Primary Examiner* — Jean B Jeanglaude
(74) *Attorney, Agent, or Firm* — Eschweiler & Potashnik, LLC

(57) ABSTRACT

A ΣΔ ADC includes a forward path, a feedback path, and offset compensation circuitry. The forward path is configured to convert an analog input signal to a digital output signal and includes analog chopper circuitry configured to shift the analog input signal to a chopper frequency to generate a chopped analog signal. The feedback path includes a ΣΔ DAC configured to convert a digital offset compensation signal configured to compensate for offset error in the analog input signal to an analog feedback signal that is subtracted from a forward path signal. The offset compensation circuitry is configured to accumulate a chopped digital signal from the forward path to generate a digital offset error signal; add the digital offset error signal to the digital output signal to generate the digital offset compensation signal; and provide the digital offset compensation signal to the ΣΔ DAC.

20 Claims, 10 Drawing Sheets

(56) References Cited

U.S. PATENT DOCUMENTS

| | | | |
|---|---|---|---|
| 8,917,195 B2 * | 12/2014 | Motz | H03M 1/02 341/110 |
| 2009/0295373 A1 | 12/2009 | Motz | |
| 2011/0063146 A1 * | 3/2011 | Matthews | H03M 3/34 341/118 |
| 2012/0262317 A1 | 10/2012 | Motz et al. | |
| 2013/0262317 A1 * | 10/2013 | Collinge | G06Q 20/3823 705/71 |
| 2013/0335131 A1 * | 12/2013 | Ceballos | G06G 7/18 327/337 |
| 2013/0335247 A1 * | 12/2013 | Ceballos | H03M 3/344 341/143 |
| 2014/0167990 A1 | 6/2014 | Motz | |

OTHER PUBLICATIONS

Jiang, J. et al. "A Continuous-Time Ripple Reduction Technique for Spinning-Current Hall Sensors." 2013, IEEE. pp. 217-220.
Matz, M. et al. "A Chopped Hall Sensor with Small Jitter and Programmable "True Power-On" Function." IEEE Journal of Solid-State Circuits, vol. 40, No. 7, Jul. 2005, pp. 1533-1540.

* cited by examiner

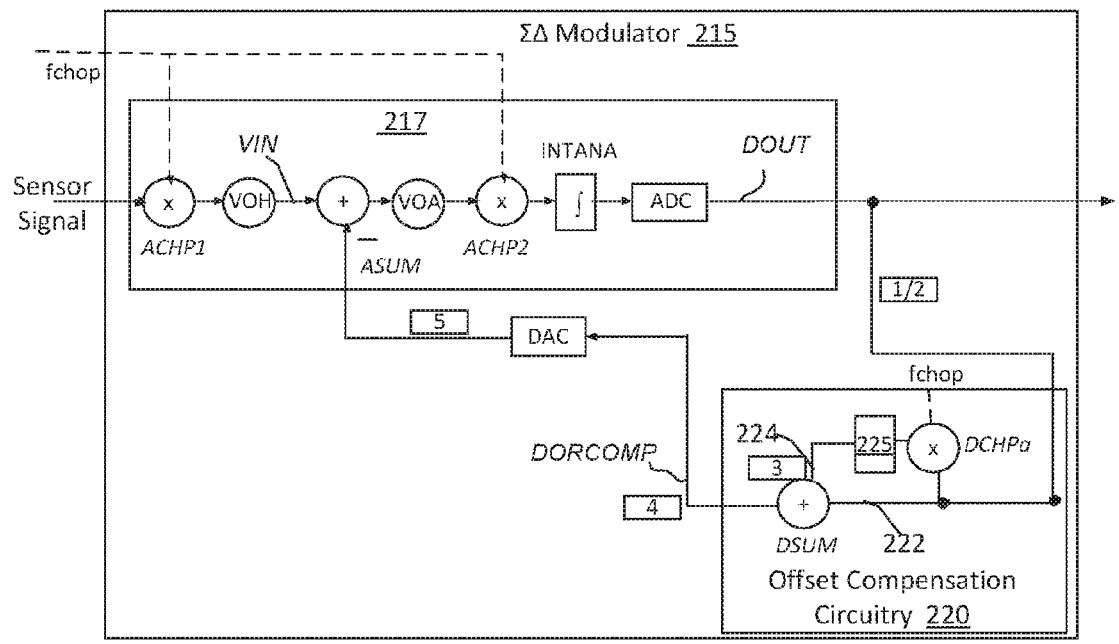
Fig. 2
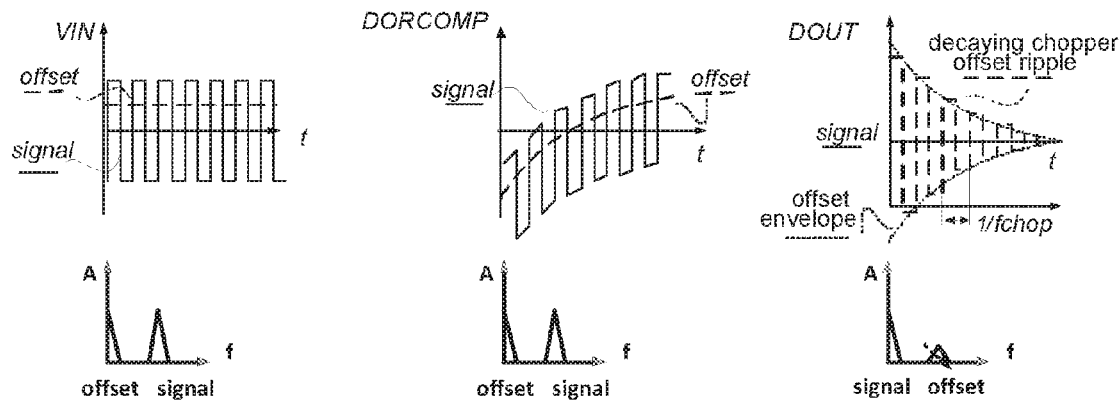
Fig. 2A  Fig. 2B  Fig. 2C

Fig. 5A  Fig. 5B  Fig. 5C

CHOPPER STABILIZED SIGMA DELTA ADC

BACKGROUND

Modern vehicles include a vast number of sensors. These "fast switching" sensors provide information about the operation of a vehicle to a digital control unit, which can take an action based upon the information. For example, the control unit may be configured to control fuel injection components based on a position of a camshaft. To this end, a toothed wheel may be affixed to the camshaft and a Hall sensor may be arranged to detect teeth on the wheel. The Hall sensor outputs an analog signal that indicates the presence (or absence) of a tooth. The Hall sensor's analog signal is converted to a digital signal by an analog to digital converter (ADC) to enable digital processing components in the fuel injection control unit to determine the position of the camshaft.

SUMMARY

In one or more embodiments, a sigma delta analog to digital converter ($\Sigma\Delta$ ADC) is provided that includes a forward path, a feedback path, and offset compensation circuitry. The forward path is configured to convert an analog input signal to a digital output signal. The forward path includes analog chopper circuitry configured to shift the analog input signal from an original frequency to a chopper frequency to generate a chopped analog signal. The feedback path includes a $\Sigma\Delta$ digital to analog converter (DAC) configured to convert a digital offset compensation signal configured to compensate for offset error in the analog input signal to an analog feedback signal that is subtracted from the chopped analog signal. The offset compensation circuitry is configured to accumulate a chopped digital signal from the forward path to generate a digital offset error signal; add the digital offset error signal to the digital output signal to generate the digital offset compensation signal; and provide the digital offset compensation signal to the $\Sigma\Delta$ DAC.

In one or more embodiments, offset compensation circuitry is provided for use in a feedback path of a sigma delta analog to digital converter ($\Sigma\Delta$ ADC) that includes a forward path and a feedback path. The forward path includes forward path circuitry configured to convert an analog input signal having a signal component and an offset error component to a digital output signal. The forward path includes first analog chopper circuitry configured to shift the analog input signal from an original frequency to a chopper frequency to generate a chopped analog input signal. The feedback path includes a $\Sigma\Delta$ digital to analog converter (DAC). The $\Sigma\Delta$ ADC is configured to subtract an analog feedback signal generated by the $\Sigma\Delta$ DAC from the chopped analog input signal. The offset compensation circuitry includes first summation circuitry; a signal path, accumulation circuitry, and a compensation path. The signal path is disposed between the forward path and the first summation circuitry and is configured to conduct a first digital signal from the forward path to the first summation circuitry. The compensation path is disposed between the signal path and the accumulation circuitry. The accumulation circuitry is configured to accumulate a chopped second digital signal from the forward path to generate a digital offset error signal that approximates the offset error component. The first summation circuitry is configured to add the digital offset error signal to the first digital signal to generate a digital offset compensation signal, wherein the digital offset compensation signal is input to the $\Sigma\Delta$ DAC.

In one or more embodiments, a method is provided that is configured to convert, with a forward path of a sigma delta analog to digital converter ($\Sigma\Delta$ ADC), an analog input signal having a signal component and an offset error component to a digital output signal. The method includes: shifting the analog input signal from an original frequency to a chopper frequency to generate a chopped analog input signal; receiving a first digital signal from the forward path; accumulating a chopped second digital signal from the forward path to generate a digital offset error signal that approximates the offset error component; adding the digital offset error signal to the first digital signal to generate a digital offset compensation signal configured to compensate for the offset error component in the analog input signal; converting the digital offset compensation signal to an analog feedback signal with a $\Sigma\Delta$ digital to analog converter (DAC) arranged in a feedback path of the $\Sigma\Delta$ ADC; and subtracting the feedback signal from the chopped analog input signal to generate the digital output signal.

BRIEF DESCRIPTION OF THE DRAWINGS

FIG. 2 illustrates a block diagram of one or more embodiments of a chopper stabilized sigma delta ($\Sigma\Delta$) analog to digital converter (ADC) that provides intrinsic offset rejection.

FIGS. 2A-2C illustrate time and frequency waveforms for the chopper stabilized sigma delta ($\Sigma\Delta$) analog to digital converter (ADC) of FIG. 2.

FIGS. 5A-5C illustrate time and frequency waveforms for the chopper stabilized sigma delta ($\Sigma\Delta$) analog to digital converter (ADC) of FIG. 5.

DETAILED DESCRIPTION

Figure 1:
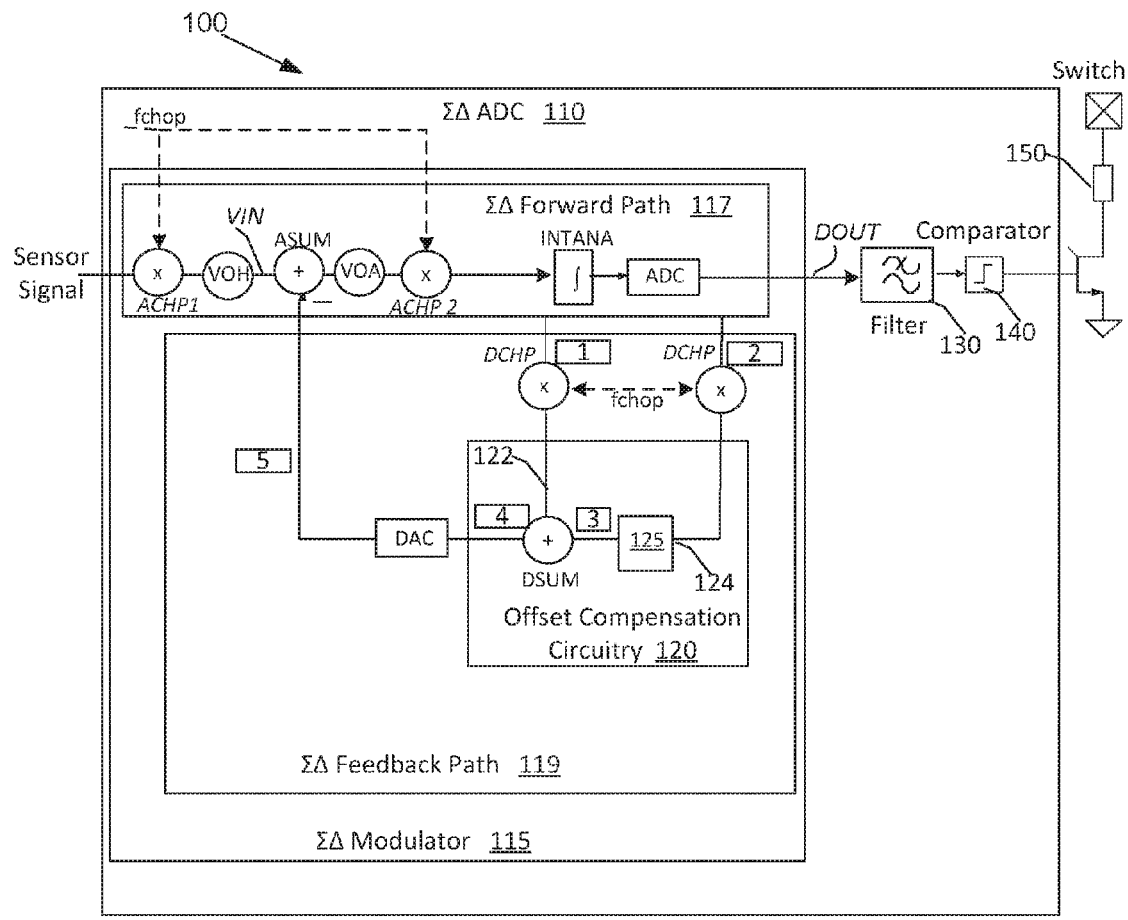
FIG. 1 illustrates a block diagram of one or more embodiments of a chopper stabilized sigma delta ($\Sigma\Delta$) analog to digital converter (ADC) that provides intrinsic offset rejection.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

As utilized herein, terms "component," "system," "interface," "circuitry" and the like are intended to refer to a set of one or more electronic components or a computer-related entity, hardware, software (e.g., in execution), and/or firmware. Various electronic components in the described circuitries are represented by a standard symbol, rather than a complete circuit architecture, for simplicity sake.

Sensors often introduce error into the analog signal they output due to intrinsic characteristics of the sensors themselves. For example, an offset error may be included in the analog signal output by a simple Hall sensor. However, spinning current techniques help to distinguish between the error and the sensor signal as will be described in more detail below. The spinning technique transforms the offset error component in the Hall sensor signal into a high frequency error (called offset ripple) while the sensor signal remains low frequency or DC.

ADCs include amplifiers or integrators that may also introduce an offset error into the signals they process. The amplifier or integrator offset error adds to the offset error introduced by the Hall sensor. To compensate for the sensor's offset error and/or amplifier offset error, some ADCs include choppers. Choppers are circuits that modulate the sensor signal to a higher frequency, which shifts the sensor output signal into a high frequency range (i.e., the chopper frequency) while the offset error component remains in a low frequency range, making the offset error component easier to distinguish from the signal component. For the purposes of this description, the modulated sensor signal at the chopper frequency output by chopper circuitry will be referred to as being "chopped" or "at the chopper frequency" to be contrasted with sensor signals that have not been modulated or have been re-modulated to the original frequency of the sensor signal, which will be referred to as having "the original frequency." These "chopper stabilized ADCs" may include an offset compensation path that is parallel to the ADC feedback path. The offset compensation path adjusts the ADC's feedback signal to compensate for the offset error. This separate offset compensation path includes several circuit components which increases the cost and complexity of the ADC.

Accordingly, some aspects of the present disclosure describe an ADC that provides inherent offset ripple rejection in a manner that reduces the number of components used for offset compensation. The disclosed offset compensation circuitry is arranged in the feedback path of a sigma delta ($\Sigma\Delta$) ADC and utilizes the $\Sigma\Delta$ ADC's DAC to generate an analog offset error compensation signal that is fed back to the $\Sigma\Delta$ ADC's forward path. The offset error compensation circuitry includes two distinct paths whose results are summed before being fed back to the forward path. A fast "signal" path routes the digital output signal directly to the summation point while a slower "compensation" path includes accumulation circuitry that gradually determines the offset error. This arrangement provides a self-calibrating ADC that can adapt to changing offset or other low frequency error introduced by a sensor or other circuit components while still providing a fast response to changes in the analog input signal.

FIG. 1 illustrates a block diagram of a one embodiment of a sensor system 100 that controls a switch to generate a digital representation of an analog sensor signal. The analog sensor signal VIN includes a signal component and an offset error component (indicated by VOH) that is introduced by the sensor. The sensor system 100 includes a chopper stabilized $\Sigma\Delta$ ADC 110 that includes a $\Sigma\Delta$ modulator 115 that converts the analog sensor signal VIN to a digital output signal (DOUT). The digital output signal is filtered by a filter 130, and the filtered digital output signal is input to a comparator 140. The comparator 140 is controlled based on digital algorithms that adaptively compute the threshold used by the comparator based on minima and maxima of previous values of the filtered digital output signal. The output of the comparator 140 controls a switch 150, which provides an amplified digital output that represents the analog sensor signal. While the embodiments herein will be discussed in the context of Hall sensors, the systems and methods herein are equally applicable to any chopper stabilized $\Sigma\Delta$ ADC that processes an analog signal that includes an offset or other low frequency error component.

The $\Sigma\Delta$ modulator 115 includes a forward path 117 and a feedback path 119. The forward path 117 typically includes a pair of analog chopper circuitries ACHP1/ACHP2, an AC difference amplifier (ASUM), an integrator (INTANA), and a coarse ADC (ADC). In one embodiment, ASUM is part of INTANA. Recall that the sensor signal from the Hall sensor may be a very small nearly DC signal with an offset error VOH that is caused by intrinsic characteristics of the Hall sensor. The analog chopper ACHP1 multiplies the analog sensor signal by a square wave having the chopper frequency fchop and amplitudes of +1 and −1. The resulting chopped analog input signal has a signal component corresponding to a square wave having period 1/fchop and an offset error component that is DC.

The AC amplifier ASUM is then used to process the chopped analog input signal. The AC amplifier also introduces a DC amplifier offset error (signified by VOA) that adds to the DC offset error VOH. After the chopped analog input signal is amplified, the amplified signal is demodulated by the second analog chopper circuitry ACHP2 to generate a signal in which the sensor component of the signal component has its original low frequency while the offset component (including both the VOH and VOA) is an AC signal at the chopper frequency. The coarse ADC converts the output of the integrator INTANA to a digital value, which is the digital output signal of the $\Sigma\Delta$ modulator 115.

The feedback path 119 of a $\Sigma\Delta$ modulator typically includes a DAC (also called the $\Sigma\Delta$ DAC) that converts the digital output signal to analog for input to the analog difference amplifier ASUM. To provide intrinsic offset error rejection, the $\Sigma\Delta$ modulator 115 also includes offset compensation circuitry 120 connected in series with the DAC in the feedback path 119. The offset compensation circuitry 120 inputs a first digital signal "1" and a second digital signal "2" from the forward path 117 and generates a digital offset compensation signal "4" that is fed back to the forward path after being converted to an analog feedback signal "5" by the DAC. In this embodiment, the analog feedback signal 5 is at the chopper frequency so that it may be added to the chopped analog input signal. In other embodiments (see FIG. 4B) the analog feedback signal is at the original (i.e., unchopped) signal frequency and is added to an unchopped forward path signal.

The second digital signal 2 is chopped by digital chopper circuitry DCHP having the same chopping frequency fchop as the analog chopper circuitries ACHP1, ACHP2. In digital chopping, the signal being chopped is multiplied with a train of +1/−1 digital data. Digital choppers do not introduce error while analog choppers introduce errors due to, among other factors, charge injection. The first digital signal 1 is input to a signal path 122 and is routed to a first summation circuitry DSUM. The first digital signal 1 is representative of, and may be equal to, the digital output DOUT of the ΣΔ modulator 115. As will be described in more detail below, in some embodiments, the first digital signal is chopped before being input to DSUM, while in other embodiments, the first digital signal is not chopped. The chopped second digital signal 2 is input to a compensation path 124 and is processed by accumulation circuitry 125 to isolate the offset error component of the chopped second digital signal 2. The accumulation circuitry 125 is configured to approximate the offset error in the second digital signal so that the output of the accumulation circuitry 125 converges to a signal that corresponds to the offset error. The resulting digital offset error signal "3" is provided to the first summation circuitry DSUM.

The first summation circuitry DSUM adds the digital offset error signal 3 to the first digital signal 1 to generate the digital offset compensation signal 4. In some embodiments, the digital offset compensation signal 4 is at the chopper frequency and thus includes an AC signal component and a DC offset component so that the when the analog version of the digital offset compensation signal (i.e., the analog feedback signal 5) is subtracted from the chopped analog input signal VIN, the offset is compensated. In other embodiments (see e.g., FIG. 4A), the digital offset compensation signal is at the original frequency having a DC signal component and an AC offset component and the output of the ΣΔ DAC is chopped by analog chopper circuitry to generate the analog feedback signal 5.

The accumulation circuitry 125 may take several samples to converge to the offset error, thus the compensation path 124 is conceptually a slow path that, when added to the first digital signal 1, gradually adjusts the first digital signal, which is closely related to the digital output of the ΣΔ modulator 115, to compensate for offset error. It can be seen from FIG. 1 that arranging the offset compensation circuitry 120 in series with the DAC in the ΣΔ modulator feedback path 119 eliminates the need for a separate compensation path, thus allowing the ΣΔ modulator's DAC to be used for offset compensation.

FIG. 2 illustrates a block diagram of a one embodiment of a chopper stabilized ΣΔ modulator 215 that can be used in a sensor system (e.g., system 100 of FIG. 1) that controls a switch to generate a digital representation of an analog sensor signal. The chopper stabilized ΣΔ modulator 215 converts an analog sensor signal to a digital output signal (DOUT). The forward path 217 of the chopper stabilized ΣΔ modulator 215 is identical to the forward path 117 of the chopper stabilized ΣΔ modulator 115 of FIG. 1. The analog chopper ACHP1 multiplies the analog sensor signal by a square wave having the chopper frequency and amplitudes of +1 and −1. The resulting chopped analog input signal VIN can be seen as having a signal component corresponding to the square wave having frequency fchop in solid line in FIG. 2A. It can be seen in FIG. 2A that the offset component of the chopped analog input signal VIN has a relatively low frequency or is a DC signal. After the chopped signal is amplified by ASUM, the amplified signal is demodulated by the second analog chopper circuitry ACHP2 to generate a signal in which the input signal component has its original low frequency while the offset component is at the chopper frequency.

The chopper stabilized ΣΔ modulator 215 includes offset compensation circuitry 220 arranged in the feedback path in series with the DAC. The offset compensation circuitry 220 inputs the digital output signal DOUT that is generated by the chopper stabilized ΣΔ modulator 215. The digital output signal DOUT may be stored in a main path output register (not shown) of the ΣΔ modulator 215. In FIG. 2, DOUT is designated ½ because in this embodiment, DOUT corresponds to both the first digital signal and the second digital signal that are input to the offset compensation circuitry 220 as described in FIG. 1.

The offset compensation circuitry 220 includes a digital chopper DCHPa that chops the digital output signal DOUT to shift the signal component of the digital output signal back to the chopper frequency so that the signal output by the offset compensation circuitry 220 can be combined with the chopped analog input signal VIN at ASUM. The resulting chopped digital output signal is input to a signal path 222 and is directly routed to the first summation circuitry DSUM. The chopped digital output signal is also input to a compensation path 224 and processed by accumulation circuitry 225 before being provided to the first summation circuitry DSUM.

The accumulation circuitry 225 is configured to approximate the offset error in the second digital signal (e.g., the chopped DOUT signal) so that the output of the accumulation circuitry 225 converges to a signal that corresponds to the offset error. This digital offset error signal 3 is added to the first digital signal to generate the digital offset compensation signal. The digital offset compensation signal 4 (also called DORCOMP) can be seen in FIG. 2B where DORCOMP converges to the chopped analog input signal VIN of FIG. 2A which has the high frequency signal component and the offset error component at DC.

The resulting DOUT waveform is shown in FIG. 2C in which the signal component is DC and the offset error is at the chopper frequency and decays to nearly zero. Thus, when the analog version of the digital offset compensation signal is subtracted from the chopped analog input sensor signal, the offset is compensated for. In other words, the offset compensation circuitry 220 provides a notch functionality as seen by the forward path while reducing the area spent for the extra feedback offset DAC that would be used if a separate compensation path were used.

Figure 3A:
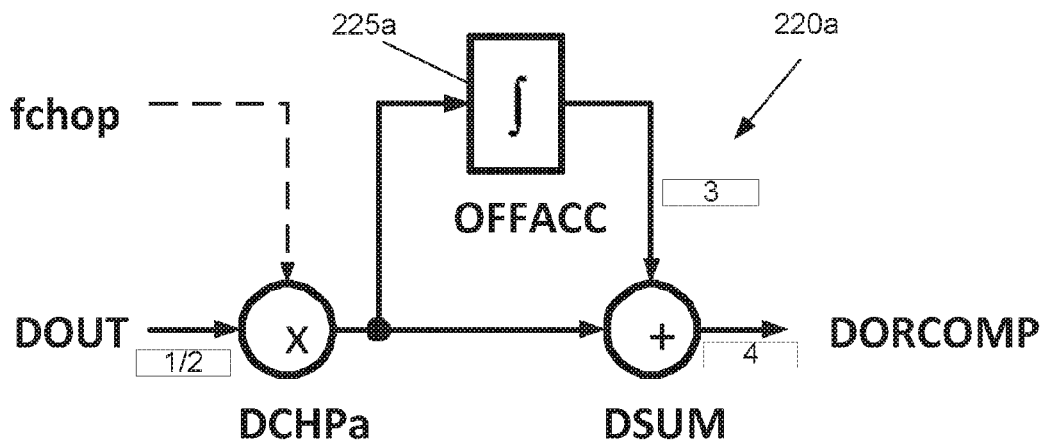
FIGS. 3A-3C illustrate different embodiments of offset compensation circuitry for the chopper stabilized sigma delta ($\Sigma\Delta$) analog to digital converter (ADC) of FIG. 2.
Figure 3B:
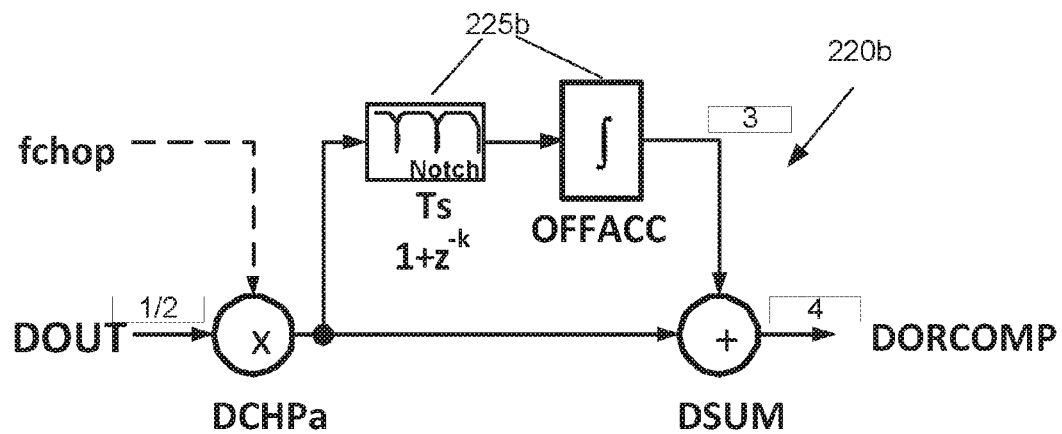
Figure 3C:
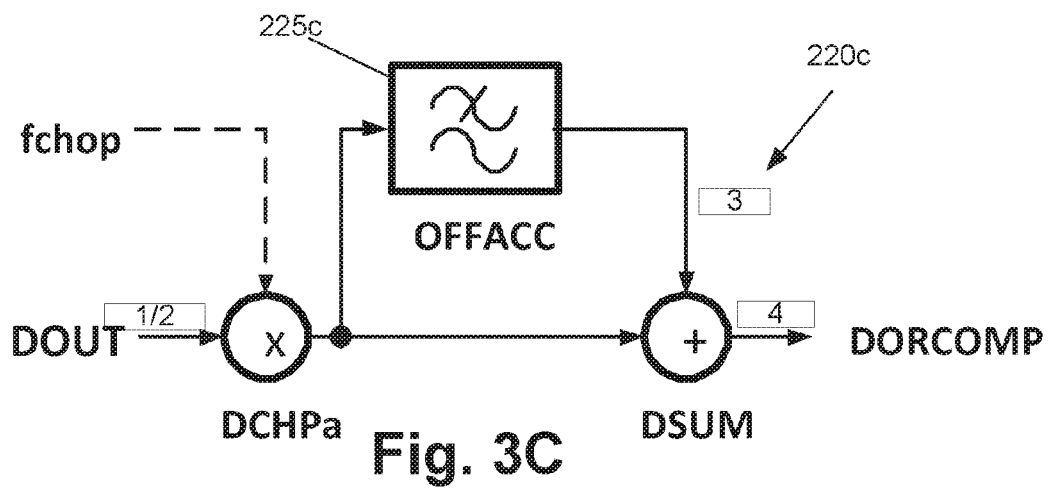

FIGS. 3A-3C illustrate three different embodiments of the offset compensation circuitry 220a-220c, respectively. In FIG. 3A, the accumulation circuitry 225a includes a digital integrator circuit. As the chopped digital output signal is integrated the signal component, which is a high frequency signal having equally positive and negative amplitudes, integrates to zero, leaving the DC offset error as the output of the accumulation circuitry 225a. In FIG. 3B, the accumulation circuitry 225b includes a digital notch filter and a digital integrator. The notch filter removes signal artifacts from the second digital signal and enhances the offset error rejection when the input to the compensation circuitry 220b is the digital output signal from the forward path. In FIG. 3C, the accumulation circuitry 225c is a sliding average filter. In other embodiments, the accumulation circuitry may be a simple filter because the combination of the gain of the signal path and the gain of the filter in the compensation path can result in reasonable offset rejection.

The various embodiments of the accumulation circuitry 225 shown in FIGS. 3A-3C can be used in any of the offset compensation circuitry embodiments described herein. The time constant of the compensation path 224 can be made faster by using a shorter accumulator. Alternatively, a longer accumulator could be used to slow the time constant of the compensation path 224. The time constant may thus be adjusted depending on 1/f noise requirements, application requirements, and so on.

Figure 4:
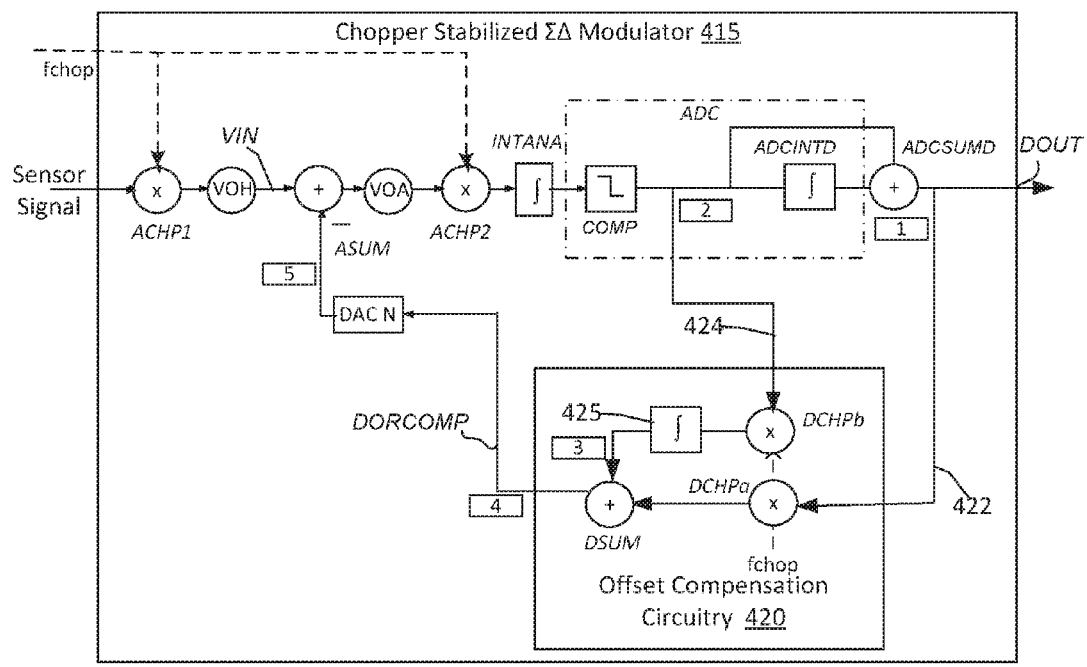
FIGS. 4, 4A and 4B illustrate a block diagrams of one or more embodiments of a chopper stabilized sigma delta ($\Sigma\Delta$) analog to digital converter (ADC) that provides intrinsic offset rejection.

FIG. 4 illustrates a block diagram of another embodiment of a chopper stabilized ΣΔ modulator 415 that includes offset compensation circuitry 420. For simplicity sake, the differences between the chopper stabilized ΣΔ modulator 415 as compared to the chopper stabilized ΣΔ modulator 215 of FIG. 2 will be described here while the similarities will not. The chopper stabilized ΣΔ modulator 415 includes a comparator COMP and a digital integrator ADCINTD that replace the coarse ADC in the forward path. The comparator COMP generates a comparator signal and the digital integrator ADCINTD generates a digital integrated signal. Second summation circuitry ADCSUM adds the comparator signal to the digital integrated signal to produce the digital output signal DOUT. This summation is done to provide stability of the overall loop by introducing a zero in the frequency response of the loopgain.

The chopper stabilized ΣΔ modulator 415 provides a simple and effective ADC with improved stability as compared to the chopper stabilized ΣΔ modulator 215. In the embodiment of FIG. 4, the first digital signal 1 is the digital output signal produced by ADCSUM while the second digital signal 2 is the comparator signal. The comparator signal is already zeroed by the action of the digital integrator and the overall negative feedback loop. Thus using the comparator signal as the second digital signal that is input to the offset compensation circuitry 420 means that no further filtering of the offset ripple is necessary.

The offset compensation circuitry 420 includes, in the signal path 422, first digital chopper circuitry DCHPa that shifts the signal component in DOUT to the chopper frequency while shifting any remaining offset error component to DC. The chopped DOUT signal is input to the first summation circuitry DSUM. The offset compensation circuitry 420 includes, in the compensation path 424, second digital chopper circuitry DCHPb that shifts the signal component of the comparator signal to the chopper frequency while shifting the offset component to DC. The chopped comparator signal is input to accumulation circuitry 425, which is configured to approximate the offset error in the chopped comparator signal so that the output of the accumulation circuitry 425 (signal 3) converges to the digital offset error. DSUM adds the digital offset error signal 3 to the chopped DOUT signal to generate the digital offset compensation signal 4. The digital offset compensation signal 4 is converted to the analog feedback signal 5 by the DAC of the ΣΔ modulator 415.

The offset compensation circuitry 420 is more robust than the offset compensation circuitry 220 of FIG. 2. Recall that offset compensation circuitry 220 inputs DOUT to the compensation path 124. In contrast, the offset compensation circuitry 420 inputs the comparator signal, which is the derivative of the DOUT signal. The DOUT signal may be corrupted by a high offset ripple at startup which might cause unrecoverable oscillation of the offset compensation circuitry 220. The comparator signal, in contrast, contains the direction of the offset ripple regardless of its amplitude, chopping frequency, meaning that the offset compensation circuitry 420 can recover the offset from any combination of offset amplitude, chopping frequency, signal frequency, and so on.

Figure 4A:
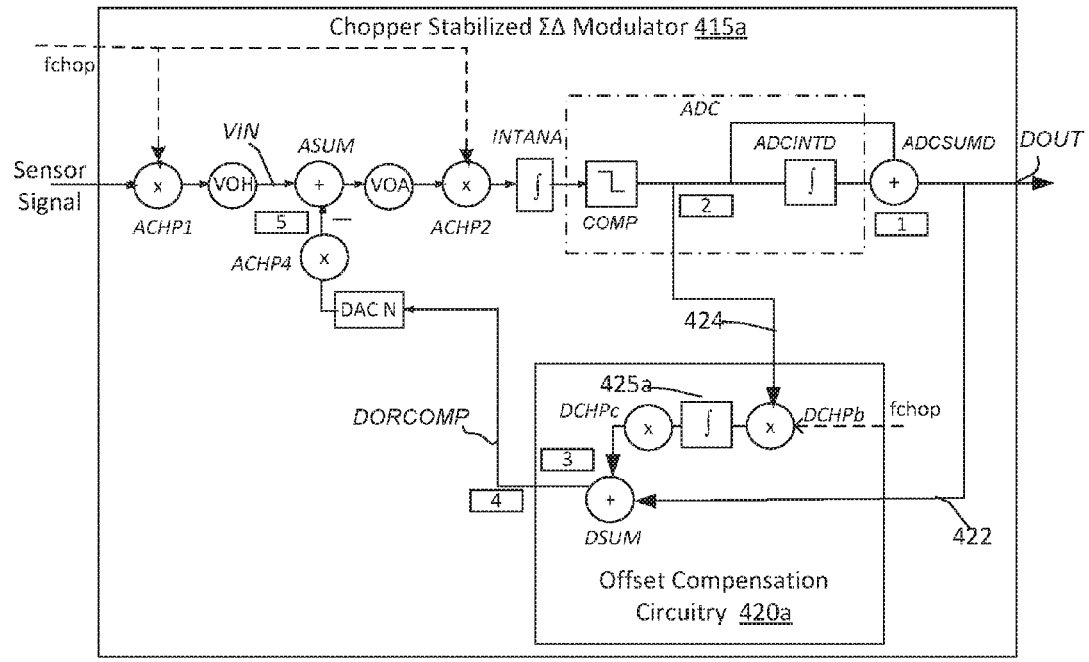
Figure 4B:
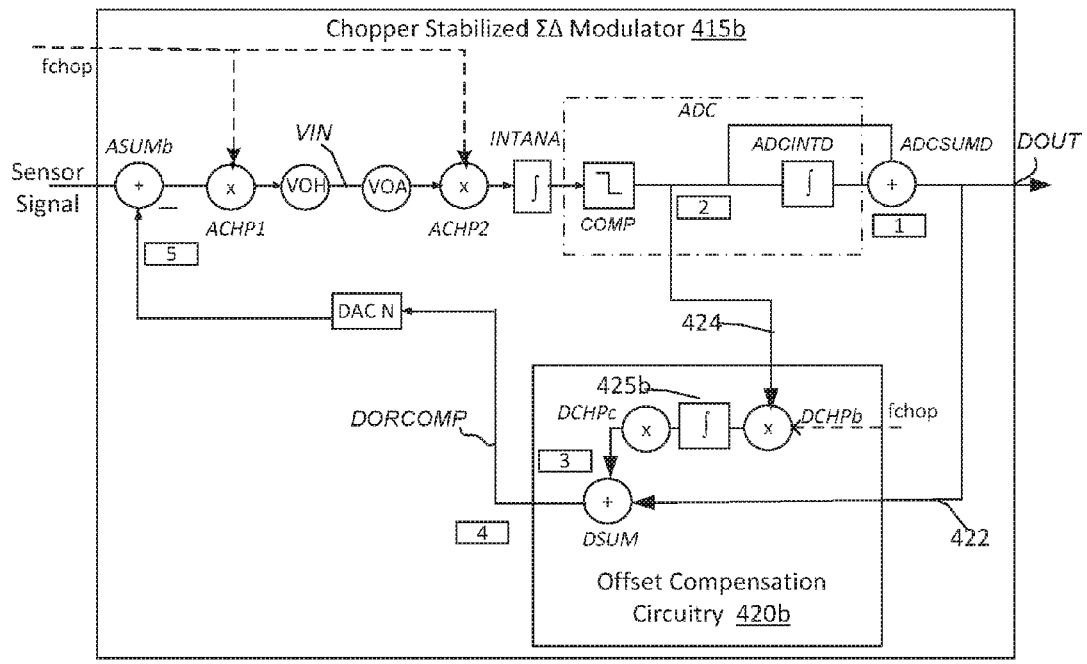

FIGS. 4A and 4B illustrate block diagrams of other embodiments of a chopper stabilized ΣΔ modulator 415a, 415b that include offset compensation circuitry 420. A comparison of ΣΔ modulator 415 and ΣΔ modulators 415a, 415b illustrate the general concept that chopper circuitries may be disposed in the feedback loop in any number of ways, as long as the analog feedback signal 5 is generated such that the analog feedback signal 5 is at the chopper frequency when being added to the chopped analog input signal or at the original frequency when being added to the unchopped analog input signal.

Referring now to FIG. 4A, the signal path 422 of offset compensation circuitry 420a does not include digital chopper circuitry and thus the digital output signal is not chopped before being input to DSUM and is at the original frequency. As with the embodiment of FIG. 4, the chopped comparator signal is input to accumulation circuitry 425a, which is configured to approximate the offset error in the chopped comparator signal so that the output of the accumulation circuitry 425 (signal 3) converges to the digital offset error. In contrast with the embodiment of FIG. 4, in the embodiment of FIG. 4A, the compensation path 424 includes, in addition to the second digital chopper circuitry DCHPb, a third digital chopper circuitry DCHPc that returns the output of the accumulation circuitry to the original frequency. Thus, the digital offset error signal 3 is at the original frequency. The digital offset compensation signal 4, which is also at the original frequency, is converted to an analog signal and a an analog chopper circuitry ACHP4 chops the output of the ΣΔ DAC to generate the analog feedback signal 5, which is at the chopper frequency.

Referring now to FIG. 4B, the signal path 422 of offset compensation circuitry 420b does not include digital chopper circuitry and thus the digital output signal is not chopped before being input to DSUM and is at the original frequency. As with the embodiment of FIGS. 4 and 4A, the chopped comparator signal is input to accumulation circuitry 425b, which is configured to approximate the offset error in the chopped comparator signal so that the output of the accumulation circuitry 425 (signal 3) converges to the digital offset error. Like the embodiment of FIG. 4A, the compensation path 424 includes, in addition to the second digital chopper circuitry DCHPb, the third digital chopper circuitry DCHPc that returns the output of the accumulation circuitry to the original frequency. Thus, the digital offset error signal 3 is at the original frequency. The digital offset compensation signal 4, which is also at the original frequency, is converted to an analog signal by the ΣΔ DAC to generate the analog feedback signal 5. Rather than being chopped prior to being added to the chopped analog input signal as in FIG. 4A, the analog feedback signal 5 is input to ASUM, which is located before the first analog chopper ACHP1 in the forward path. Thus the analog input signal has not yet been chopped and so the unchopped analog feedback signal 5 output by the ΣΔ DAC may be added to the unchopped analog input signal.

Figure 5:
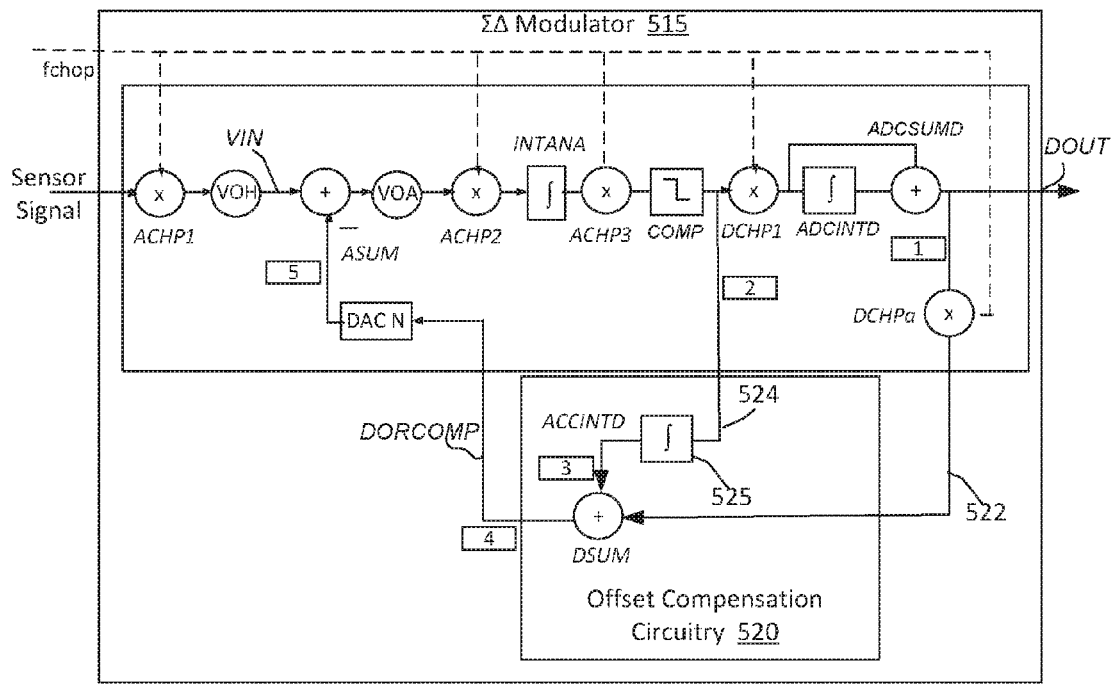
FIG. 5 illustrates a block diagram of one or more embodiments of a chopper stabilized sigma delta ($\Sigma\Delta$) analog to digital converter (ADC) that provides intrinsic offset rejection.

FIG. 5 illustrates a block diagram of another embodiment of a chopper stabilized ΣΔ modulator 515 that includes offset compensation circuitry 520. For simplicity sake, the differences between the chopper stabilized ΣΔ modulator 515 as compared to the chopper stabilized ΣΔ modulator 415 of FIG. 4 will be described here while the similarities will not. The chopper stabilized ΣΔ modulator 515 includes, in the forward path, a third analog chopper that generates a second chopped analog signal that is input to the comparator. The second chopped analog signal includes a signal component having the chopper frequency and an error component at DC. This way the offset of the comparator adds on top of the already existing error and can also be removed by the loop. The comparator generates a chopped comparator signal that is the input to the compensation path 524. The forward path also includes a first digital chopper DCHP1 that demodulates the chopped comparator signal by shifting the error component of the comparator signal to fchop while shifting the signal component back to the original frequency prior to generate a comparator signal. The comparator signal is integrated by the digital integrator ADCINTD.

The ADCSUMD adds the comparator signal to the output of the digital integrator to generate DOUT. In the embodiment of FIG. 5, the first digital signal 1 is the DOUT signal produced by ADCSUM while the second digital signal 2 is the chopped comparator signal. The DOUT signal is shown in FIG. 5C.

The offset compensation circuitry 520 includes a signal path 522 that includes second digital chopper circuitry configured to chop DOUT to shift the signal component to the chopper frequency while shifting the error component to DC. The resulting chopped DOUT is input to the first summation circuitry DSUM. The offset compensation circuitry 520 includes, in the compensation path 524, accumulation circuitry 525, which is configured to approximate the offset error in the chopped comparator signal so that the output of the accumulation circuitry 525 converges to the digital offset error (e.g., signal 3). The output of the digital integrator ACCINTD, which gradually converges to the offset error, can be seen in FIG. 5A. DSUM adds the digital offset error signal 3 the chopped DOUT signal to generate the digital offset compensation signal 4, which is illustrated in FIG. 5B. The digital offset compensation signal 4 is converted to the analog feedback signal 5 by the DAC of the ΣΔ modulator 515.

There are several effects that may create a Hall offset that is not a pure DC signal at VIN. The back-bias effect, the Seebeck effect or anisotropy of the Hall resistance may cause the VOH error to have an AC part overlaid on the main DC offset already discussed. In a more general case, VOH is split into three possible frequency components—DC, fchop, and fchop/2. The latter two components are usually created by the same effects already discussed. The offset compensation circuitry 220, 420, 520 are able to reject the DC component of VOH via the notch functionality created by the accumulation circuitry 225, 425, 525. The fchop and fchop/2 components of VOH are AC errors that may usually be filtered away by the filter 130 (see FIG. 1). However, in some applications where high signal bandwidth or low delay are critical, filtering may not be a good option.

Figure 6:
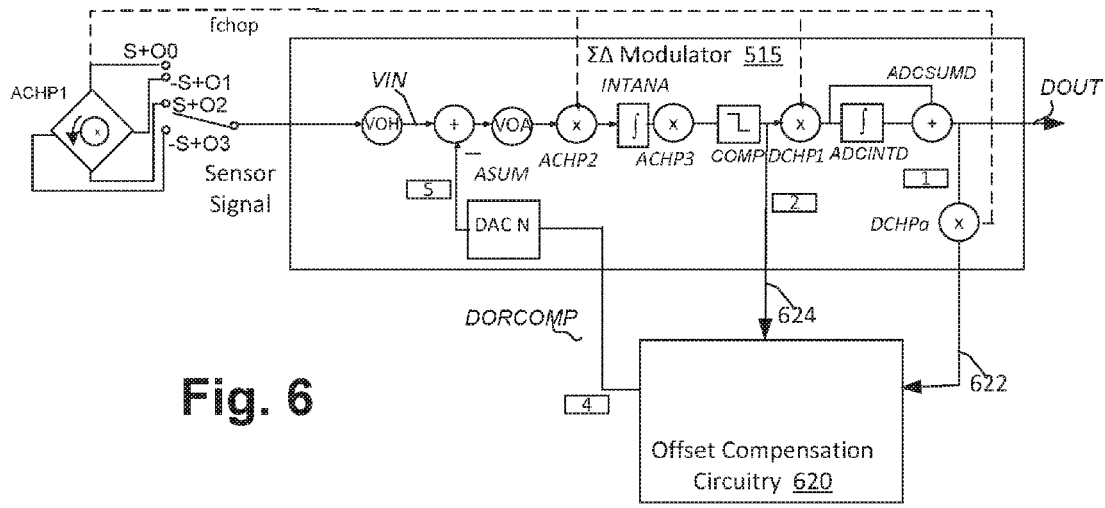
FIGS. 6-6A illustrate or more embodiments embodiment of offset compensation circuitry for a chopper stabilized sigma delta ($\Sigma\Delta$) analog to digital converter (ADC) that provides four phase demodulation.
Figure 6A:
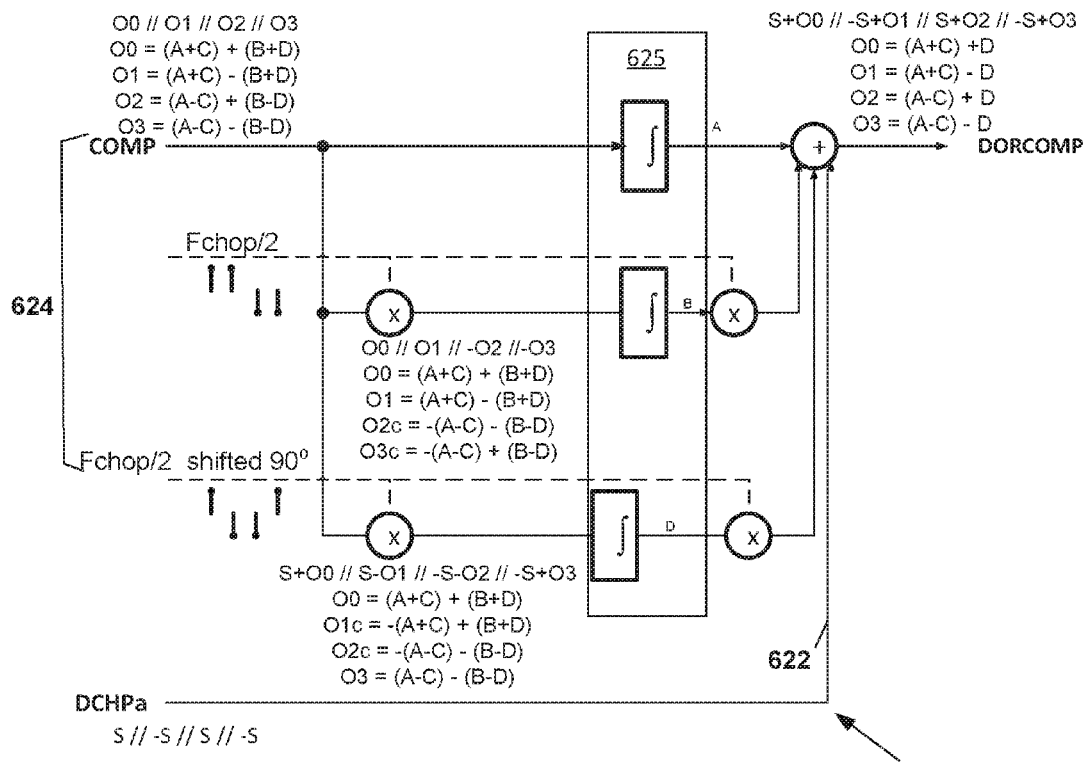

FIG. 6 illustrates one embodiment the chopper stabilized ΣΔ modulator 515 that includes offset compensation circuitry 620 configured to compensate for the AC errors in VOH as well as the DC component. The AC errors are denoted by the four different signals output by the spinning hall sensor (indicated as ACHP1 in FIG. 1). FIG. 6A illustrates one embodiment of the compensation circuitry 620. The compensation is accomplished in a continuous time manner by using the chopped comparator signal as input to four accumulators—one accumulator for the signal (ADCINTD) and three accumulators in a compensation path 624 of the offset compensation circuitry 620 for the distinguishable frequency components of the offset (O0, O1, O2, O3), with the effect of having all types of offsets (backbias, Seebeck, and so on) removed already by the notch function of the offset compensation circuitry 620 in the feedback loop, which is shown in FIG. 6A.

A first branch of the compensation path 624 includes a first accumulator that accumulates the chopped comparator signal to produce signal A. The first accumulator is functionally similar to the accumulation circuitry 125, 225, 425, and 525 already described. In a second branch, the comparator signal is chopped at Fchop/2 to bring the C component of the offset error to DC while the other parts, including the actual signal are high frequency signals (either at Fchop/2 or at Fchop). The accumulator in the second branch will gradually converge to C. In a third branch the compactor signal at Fchop/2 but shifted by 90 degrees, the part of the offset error called D is brought to DC, while the other parts, including the actual signal are high frequency signals at Fchop/2 or Fchop). Then the accumulator in the third branch will gradually converge to D. By summing A, chopped C, chopped D, and DCHPa, which is the chopped signal, the various offset components A, C, and D may be compensated. The component B, if it exists, will not be distinguishable from the signal because it appears at the same frequency and at the same phase as the signal.

The offset compensation circuitry 620 uses only four accumulators because the chopped comparator signal is the input. No sampling occurs and the offset compensation circuitry 620 uses no registers and four accumulators to solve a system with four unknowns. Note that with proper arrangement of the digital choppers, the offset compensation circuitry 620 can be used in place of the offset compensation circuitry 420. With proper arrangement of choppers, the offset compensation circuitry 620 can adapted for use regardless of the spinning strategy chosen (e.g., clockwise, counterclockwise, 0, 90, 180, 270, and so on).

Figure 7:
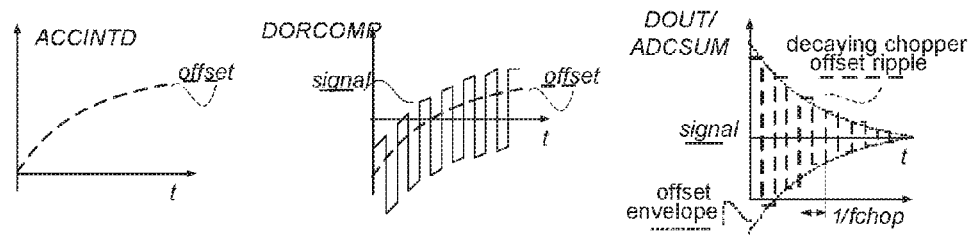
FIG. 7 illustrates a block diagram of one or more embodiments of an offset accumulator for use in offset compensation circuitry.
Figure 7:
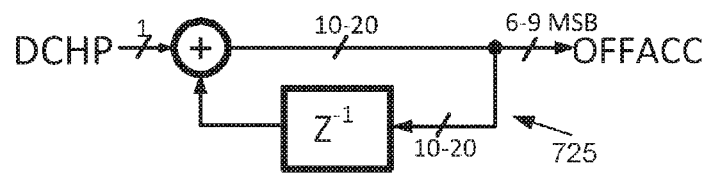

FIG. 7 illustrates one embodiment of accumulation circuitry 725 that can be used to implement the accumulation circuitry 125, 225, 425, or 525. The accumulation circuitry 725 may be used to adjust the time constant of the compensation path 120, 220, 420, 520. The accumulation circuitry 725 includes a third summation circuitry configured to add a feedback signal from an accumulator or delay element of variable width ($z^{-1}$) to a chopped digital forward path signal to generate the digital offset error signal (e.g., signal 3 in FIGS. 1, 2, 4, 5, 6, and 8). The accumulator's width varies between 10 and 20 bits, while a fewer number (e.g., 6-9) of the most significant bits of the digital offset error signal are output by the accumulation circuitry.

Figure 8:
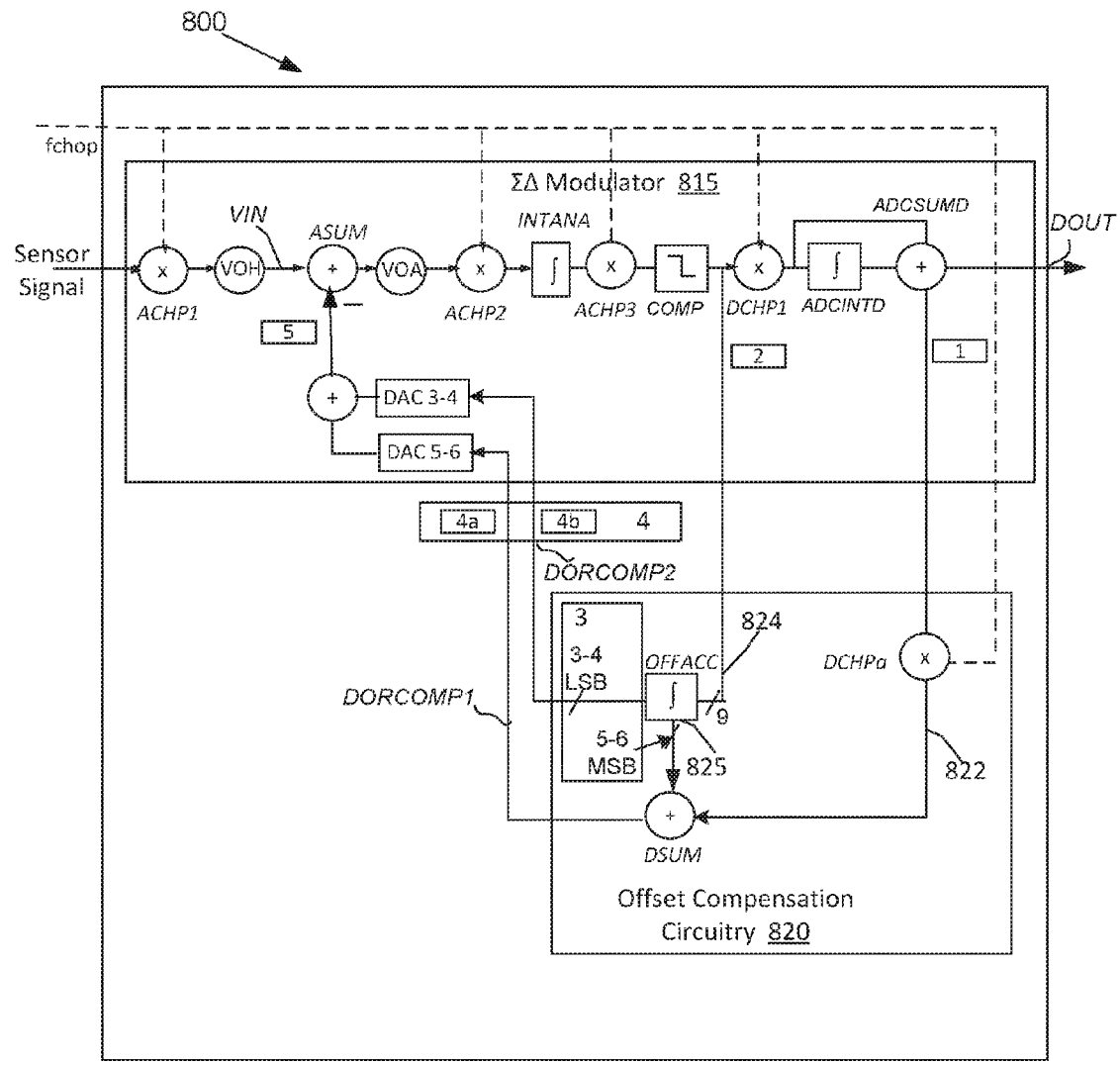
FIG. 8 illustrates a block diagram of one or more embodiments of a chopper stabilized sigma delta ($\Sigma\Delta$) analog to digital converter (ADC) that provides intrinsic offset rejection.

The width of the accumulator ($z^{-1}$) may be varied with time for optimum performance. The width of the accumulator may be reduced to make the compensation path faster or increased to make the compensation path slower, depending on the 1/f noise requirements, application requirements, and so on. At startup the accumulator may be replaced by a fast tracking or a successive approximation (SAR) register. A SAR is a type of binary analog to digital converter that is faster than a ΣΔ ADC, but not as precise. The SAR may be used at start up to reach a fast, approximate value for the offset error and then the offset compensation circuitry may enter normal operating mode to enhance the accuracy of the estimated offset error. In other words, at startup each chopping phase may be kept for a certain period time in which the ΣΔ modulator may work in a fast tracking mode or in a SAR mode to obtain an initial offset value with which the accumulator may be initialized. As discussed with respect to FIGS. 3A-3C, the accumulator may also be a sliding average filter or a simple high gain filter FIG. 8 illustrates one embodiment of a chopper stabilized ΣΔ modulator 815 that includes offset compensation circuitry 820 that is adapted for use when the sampling frequency to chopping frequency ratio is low. The offset compensation circuitry 820 is useful when the signal path component of the digital offset compensation signal needs to be more accurate than the compensation path component of the digital offset compensation signal, but the compensation path should still have improved resolution. In the chopper stabilized ΣΔ modulator 815, a high precision 5-6 bit DAC is used for the signal component 1 of the digital offset compensation signal 4 and the most significant bits (MSBs) of the digital offset error component 3 of the digital offset compensation signal 4. An additional 3-4 bit DAC can be used for least significant bits (LSBs) of the digital offset error signal 3 to extend the resolution of the digital offset compensation signal 4. The offset compensation circuitry 820 provides a digital offset compensation signal with two components 4a and 4b that are routed to different bits of the DAC. The first digital offset compensation signal component 4a is used for signal matching and also provides the MSBs of the digital offset error signal 3 while the second digital offset compensation signal component 4b is used to further suppress the offset by providing the LSBs of the digital offset error signal 3. The 3-4 bit DAC may be monotonic.

Figure 9:
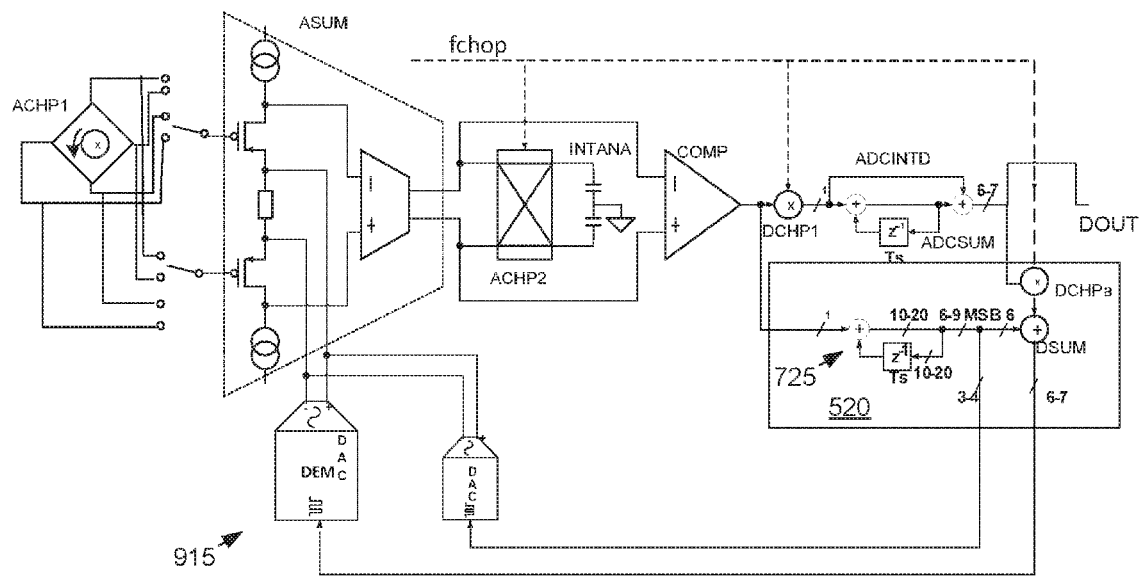
FIG. 9 illustrates a block diagram of one or more embodiments of an analog implementation of the chopper stabilized sigma delta ($\Sigma\Delta$) analog to digital converter (ADC) of FIG. 5.

FIG. 9 illustrates one embodiment of an analog implementation of a ΣΔ modulator 915 that is similar to the ΣΔ modulator 515 of FIG. 5. The analog components in FIG. 9 are labeled with their corresponding functional components of the ΣΔ modulator 515 (e.g., ACHP1, ASUM, ACHP2, INTANA, COMP, DCHP1, ADCINTD, ADCSUM, DCHPa, DSUM, and DAC (two shown)). It can be seen in FIG. 9 that the comparator is in a chopping loop defined between ACHP1 and DCHP1 and thus the offset error introduced by the comparator is rejected by the compensation circuitry 520. Note that the analog chopper ACHP3 of FIG. 5 is implied in the embodiment illustrated in FIG. 9, but is not physically present.

Figure 10:
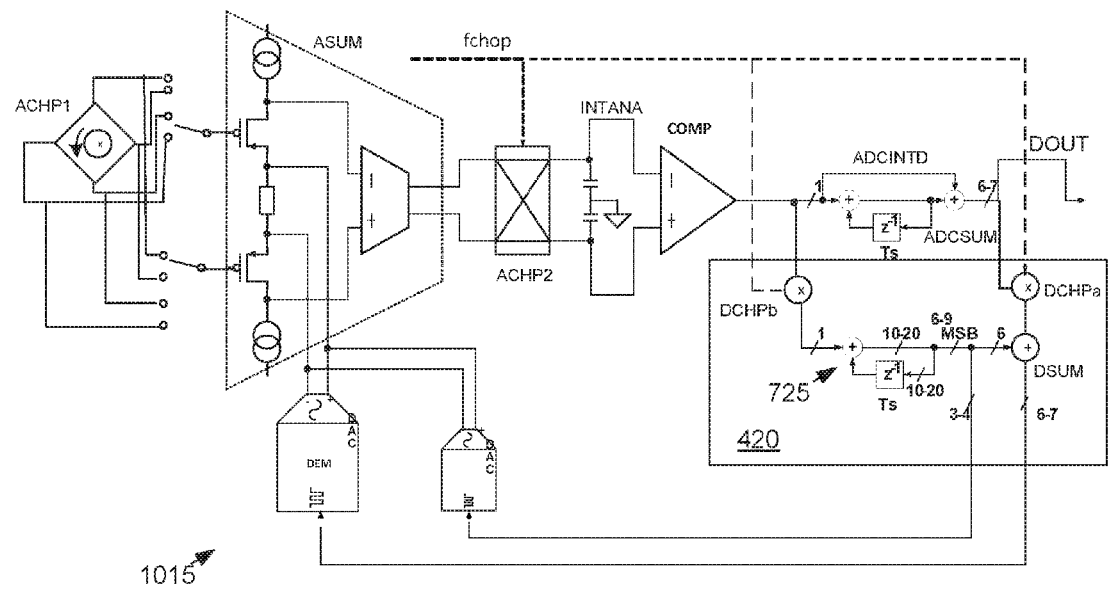
FIG. 10 illustrates a block diagram of one or more embodiments of an analog implementation of the chopper stabilized sigma delta ($\Sigma\Delta$) analog to digital converter (ADC) of FIG. 4.

FIG. 10 illustrates one embodiment of an analog implementation of a ΣΔ modulator 1015 that is similar to the ΣΔ modulator 415 of FIG. 4. The analog components in FIG. 10 are labeled with their corresponding functional components of the ΣΔ modulator 415 (e.g., ACHP1, ASUM, ACHP2, INTANA, COMP, DCHP1, ADCINTD, ADCSUM, DCHPa, DSUM, and DAC (two shown)). It can be seen in FIG. 10 that the comparator is outside a chopping loop defined between ACHP1 and ACHP2 and thus the offset error introduced by the comparator will not be rejected by the compensation circuitry 520.

The chopper stabilized ΣΔ ADC described herein are well suited for dynamic element matching, in which hardware components are rearranged to equalize the delay introduced in each signal path. Usually, ADCs used for fast switching speed sensors, such as speed sensors or CAM sensors use a tracking/SAR ADC. The tracking/SAR ADC provides up to 11 bit resolution or even more, based a DAC with up to 11 bits. It is challenging to do DEM techniques on such a high resolution DAC because it involves separate access to each DAC unit (there are 2^11 of them.) Using a sigma delta ACD allows for a lower resolution DAC (6 bit in the described embodiments) without any loss in overall resolution because 11 or more bits may be obtained after filtering in the digital domain. The 6 bit DAC suits itself to DEM techniques because there are only 64 current sources, (2^6) or unit elements in the DAC which must be rotated or switched etc.

Figure 11:
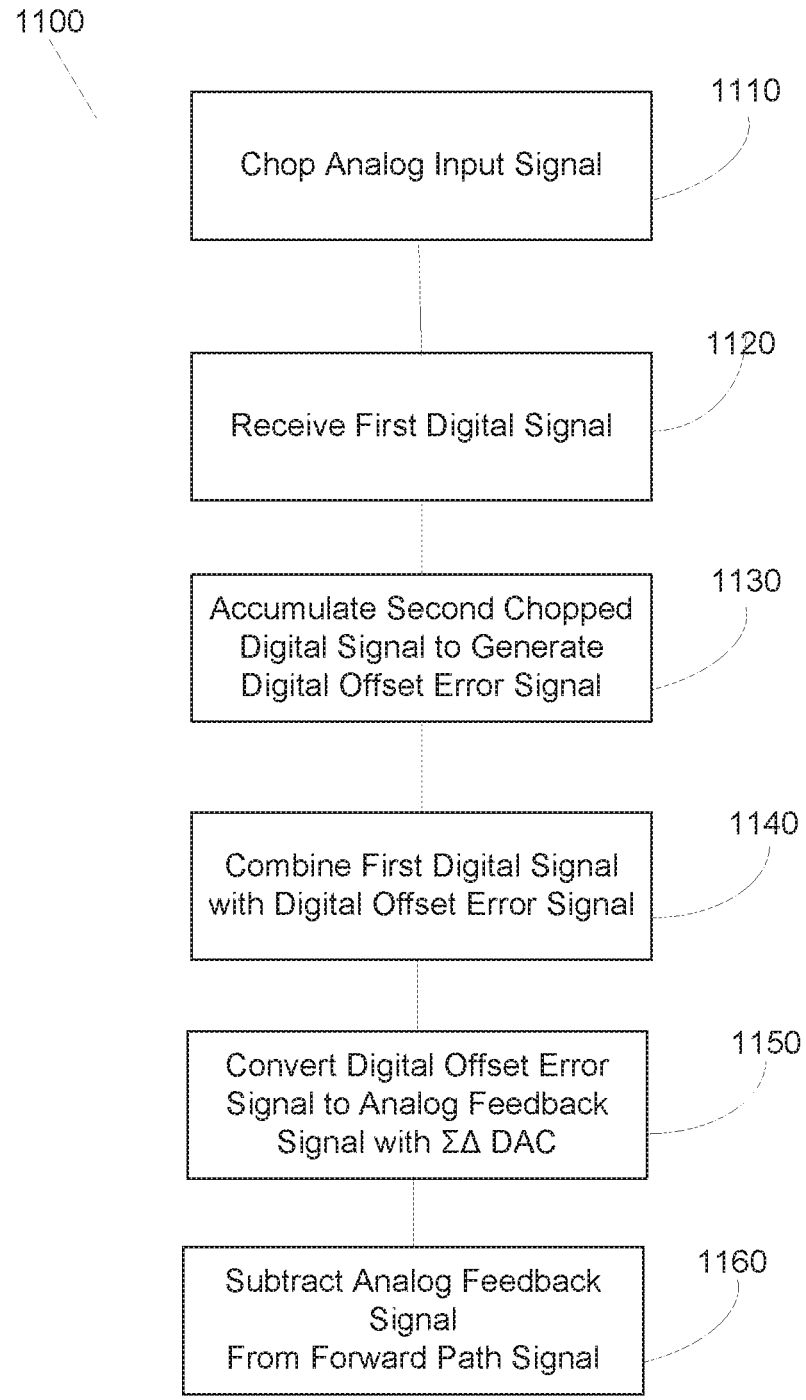
FIG. 11 illustrates a flow diagram describing one or more embodiments of a method of converting an analog sensor signal to a digital signal.

FIG. 11 illustrates a flow diagram outlining a method 1100 that is configured to convert, with a forward path of a sigma delta analog to digital converter (ΣΔ ADC), an analog input signal having a signal component and an offset error component to a digital output signal. The method includes, at 1110, shifting the analog input signal from an original frequency to a chopper frequency to generate a chopped analog input signal. This function may be performed by ACHP1 in FIGS. 1, 2, 4, 5, 6, and 8. At 1120, the method includes receiving a first digital signal from the forward path. At 1130, the method includes accumulating a chopped second digital signal from the forward path to generate a digital offset error signal that approximates the offset error component. This function may be performed by accumulation circuitry 125, 225, 425, 525, 625, and 825, in FIGS. 1, 2, 4, 5, 6, and 8, respectively. At 1140, the method includes adding the digital offset error signal to the first digital signal to generate a digital offset compensation signal configured to compensate for the offset error component in the analog input signal. This function may be performed by DSUM in FIGS. 1, 2, 4, 5, 6, and 8. At 1150, the method includes converting the digital offset compensation signal to an analog feedback signal with a ΣΔ digital to analog converter (DAC) arranged in a feedback path of the ΣΔ ADC. This function may be performed by the DAC in FIGS. 2, 4, 5, 6, and 8. At 1160, the method includes subtracting the analog feedback signal from a forward path signal (e.g., the "unchopped analog input signal or the chopped analog input signal). This function may be performed by ASUM in FIGS. 1, 2, 4, 5, 6, and 8.

In one or more embodiments the method includes shifting the digital offset error signal from the chopper frequency to the original frequency to generate an unchopped digital offset error signal; and combining the unchopped digital offset error with the digital output signal to generate the digital offset compensation signal at the original frequency, such that the analog feedback signal is at the original frequency. In one or more embodiments, the method also includes shifting the analog feedback signal from the original frequency to the chopper frequency to generate a chopped analog feedback signal; and subtracting the chopped analog feedback signal from the chopped analog input signal.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A sigma delta analog to digital converter (ΣΔ ADC) comprising:
 a forward path configured to convert an analog input signal to a digital output signal, wherein the forward path comprises analog chopper circuitry configured to shift the analog input signal from an original frequency to a chopper frequency to generate a chopped analog signal;
 a feedback path comprising a ΣΔ digital to analog converter (DAC) configured to convert a digital offset compensation signal configured to compensate for offset error in the analog input signal to an analog feedback signal that is subtracted from a forward path signal; and
 offset compensation circuitry configured to:
  accumulate a chopped digital signal from the forward path to generate a digital offset error signal;
  combine the digital offset error signal with the digital output signal to generate the digital offset compensation signal; and
  provide the digital offset compensation signal to the ΣΔ DAC.

2. The ΣΔ ADC of claim 1, wherein the forward path comprises i) comparator circuitry configured to generate a comparator signal, ii) digital integrator circuitry configured to generate a digital integrated signal, and iii) second summation circuitry configured to add the comparator signal to the digital integrated signal to stabilize the digital output signal, further wherein the chopped digital signal comprises a chopped comparator signal at the chopper frequency.

3. The ΣΔ ADC of claim 1, wherein the analog input signal comprises an output of a fast switching sensor.

4. The ΣΔ ADC of claim 1, wherein the compensation circuitry comprises digital chopper circuitry configured to shift the digital offset error signal from the chopper frequency to the original frequency to generate an unchopped digital offset error signal that is combined with the digital output signal to generate the digital offset compensation signal at the original frequency.

5. The ΣΔ ADC of claim 4, wherein:
 the forward path signal comprises the chopped analog input signal; and
 the feedback path comprises second analog chopper circuitry configured to shift the analog feedback signal from the original frequency to the chopper frequency to generate a chopped analog feedback signal that is subtracted from the chopped analog input signal.

6. The ΣΔ ADC of claim 4, wherein the forward path signal comprises the analog input signal at the original frequency.

7. An offset compensation circuitry for use in a feedback path of a sigma delta analog to digital converter (ΣΔ ADC), wherein the ΣΔ ADC comprises a forward path comprising forward path circuitry configured to convert an analog input signal having a signal component and an offset error component to a digital output signal, wherein the forward path comprises first analog chopper circuitry configured to shift the analog input signal from an original frequency to a chopper frequency to generate a chopped analog input signal, and wherein the feedback path comprises a ΣΔ digital to analog converter (DAC), and wherein the ΣΔ ADC is configured to subtract an analog feedback signal generated by the ΣΔ DAC from a forward path signal, the offset compensation circuitry comprising:
 first summation circuitry;
 a signal path disposed between the forward path and the first summation circuitry, the signal path configured to conduct a chopped first digital signal from the forward path to the first summation circuitry;
 accumulation circuitry;
 a compensation path disposed between the signal path and the accumulation circuitry, wherein the accumulation circuitry is configured to accumulate a chopped second digital signal from the forward path to generate a digital offset error signal that approximates the offset error component; and
 wherein the first summation circuitry is configured to add the digital offset error signal to the first digital signal to generate a digital offset compensation signal, wherein the digital offset compensation signal is input to the ΣΔ DAC.

8. The offset compensation circuitry of claim 7, wherein the signal path comprises a first digital chopper configured to shift the digital output signal to the chopper frequency to generate the first digital signal, such that the digital offset compensation signal is at the chopper frequency.

9. The offset compensation circuitry of claim 7, wherein:
 the compensation path comprises a third digital chopper configured to shift an output of the accumulation circuitry to the original frequency to generate the digital offset compensation signal, such that the digital offset compensation signal is at the original frequency;
 the feedback path comprises a second analog chopper circuitry configured to shift an output of the ΣΔ DAC to the chopper frequency to generate the analog feedback signal.

10. The offset compensation circuitry of claim 7, wherein the accumulation circuitry comprises third summation circuitry configured to add a chopped digital signal having the signal component at the chopper frequency to a prior value of the digital offset error signal to generate the digital offset error signal.

11. The offset compensation circuitry of claim 10 wherein the accumulation circuitry is configured to output a selected number of most significant bits of the digital offset error signal and while the prior value of the digital offset error comprises all bits of the digital offset error signal.

12. The offset compensation circuitry of claim 7, wherein the forward path comprises i) comparator circuitry configured to generate a comparator signal, ii) digital integrator circuitry configured to generate a digital integrated signal, and iii) second summation circuitry configured to add the comparator signal to the digital integrated signal to stabilize the digital output signal, further wherein:
 the signal path comprises first digital chopper circuitry configured to shift the digital output signal to the chopper frequency to generate the first digital signal;
 the compensation path comprises second digital chopper circuitry, wherein the second digital chopper circuitry is configured to shift the comparator signal to the chopper frequency to generate the chopped second digital signal.

13. The offset compensation circuitry of claim 12, wherein the forward path comprises second analog chopper circuitry configured to shift a signal component of the forward path signal back to the original frequency while shifting the offset error component to the chopper frequency to generate second forward path signal, and further wherein the comparator inputs the second forward path signal such that the comparator is outside a chopping loop defined by the first analog chopper circuitry and the second analog chopper circuitry.

14. The offset compensation circuitry of claim 7, wherein the forward path comprises i) comparator circuitry configured to generate a chopped comparator signal from a chopped analog signal in the forward path having the chopper frequency, ii) first digital forward path digital chopper circuitry configured to shift the chopped comparator signal to the original frequency to generate a comparator signal, iii) digital integrator circuitry configured to integrate the comparator signal to generate a digital integrated signal, iv) second summation circuitry configured to add the comparator signal to the digital integrated signal to generate the digital output signal, further wherein:
the first digital signal comprises the digital output signal; and
the chopped second digital signal comprises the chopped comparator signal.

15. The offset compensation circuitry of claim 14, wherein the comparator is inside a chopping loop defined by the first analog chopper circuitry and the firsts digital chopper circuitry.

16. The offset compensation circuitry of claim 14, wherein the accumulation circuitry comprises:
a first branch comprising first accumulator circuitry that inputs the chopped comparator signal and generates a first branch signal;
a second branch comprising:
first branch chopper circuitry configured to shift a first portion of the error component of the chopped comparator signal to DC to generate a first shifted error component;
second accumulator circuitry that inputs the first shifted error component and generates a first integrated branch signal; and
second branch chopper circuitry configured to shift the error component of the first integrated branch signal to the original frequency to generate a second branch signal; and
a third branch comprising:
third branch chopper circuitry that is shifted 90 degrees in phase as compared to the first branch chopper circuitry and is configured to shift a second portion of the error component of the chopped comparator signal to DC to generate a second shifted error component;
third accumulator circuitry that inputs the second shifted error component and generates a second integrated branch signal; and
fourth branch chopper circuitry configured to shift the error component of the second integrated branch signal to the original frequency to generate a third branch signal; and
wherein the first summation circuitry is configured to combine the first branch signal, the second branch signal, the third branch signal, and the chopped first digital signal to generate the digital offset compensation signal.

17. The offset compensation circuitry of claim 14, wherein the ΣΔ DAC comprises a first DAC and a second DAC and DAC summation circuitry that combines the outputs of the first DAC and the second DAC, further wherein:
the accumulation circuitry is configured to:
provide a selected number of most significant bits of the digital offset error signal to the first summation circuitry; and
provide a selected number of least significant bits of the digital offset error signal to the second DAC; and
the first summation circuitry is configured to provide a first digital offset compensation signal to the first DAC that comprises the most significant bits of the digital offset error signal combined with the chopped first digital signal.

18. A method, configured to convert, with a forward path of a sigma delta analog to digital converter (ΣΔ ADC), an analog input signal having a signal component and an offset error component to a digital output signal, the method comprising:
in a forward path, shifting the analog input signal from an original frequency to a chopper frequency to generate a chopped analog input signal;
in a feedback path,
receiving a first digital signal from the forward path;
accumulating a chopped second digital signal from the forward path to generate a digital offset error signal that approximates the offset error component;
combining the digital offset error signal with the first digital signal to generate a digital offset compensation signal configured to compensate for the offset error component in the analog input signal;
converting the digital offset compensation signal to an analog feedback signal with a ΣΔ digital to analog converter (DAC) arranged in a feedback path of the ΣΔ ADC; and
subtracting the feedback signal from a forward path signal to generate the digital output signal.

19. The method of claim 18, further comprising:
shifting the digital offset error signal from the chopper frequency to the original frequency to generate an unchopped digital offset error signal; and
combining the unchopped digital offset error with the digital output signal to generate the digital offset compensation signal at the original frequency, such that the analog feedback signal is at the original frequency.

20. The method of claim 19, further comprising:
shifting the analog feedback signal from the original frequency to the chopper frequency to generate a chopped analog feedback signal; and
subtracting the chopped analog feedback signal from the chopped analog input signal.

* * * * *